United States Patent
Rud et al.

(10) Patent No.: US 7,821,437 B1
(45) Date of Patent: Oct. 26, 2010

(54) LINE NOISE ANALYSIS AND DETECTION AND MEASUREMENT ERROR REDUCTION

(75) Inventors: Jason Harold Rud, Mayer, MN (US); Douglas Wayne Arntson, Maple Grove, MN (US)

(73) Assignee: Rosemount Inc., Eden Prairie, MN (US)

( * ) Notice: Subject to any disclaimer, the term of this patent is extended or adjusted under 35 U.S.C. 154(b) by 83 days.

(21) Appl. No.: 12/420,461

(22) Filed: Apr. 8, 2009

(51) Int. Cl.
*H03M 1/00* (2006.01)
(52) U.S. Cl. ............... 341/123; 341/143; 341/155
(58) Field of Classification Search .......... 341/123, 341/155
See application file for complete search history.

(56) References Cited

U.S. PATENT DOCUMENTS

| | | | |
|---|---|---|---|
| 4,515,163 A | 5/1985 | Flax et al. | |
| 5,053,983 A | 10/1991 | Hyatt | |
| 5,831,524 A | 11/1998 | Tice et al. | |
| 6,140,952 A * | 10/2000 | Gaboury | 341/143 |
| 6,452,521 B1 * | 9/2002 | Wang et al. | 341/139 |
| 6,637,934 B1 * | 10/2003 | Henderson et al. | 374/178 |
| 7,076,403 B2 | 7/2006 | Tice | |
| 7,126,516 B2 | 10/2006 | Koc et al. | |
| 2007/0098119 A1 | 5/2007 | Stothers et al. | |

FOREIGN PATENT DOCUMENTS

| | | |
|---|---|---|
| JP | 59220830 | 12/1984 |
| JP | 8018457 | 1/1996 |

* cited by examiner

*Primary Examiner*—Khai M Nguyen
(74) *Attorney, Agent, or Firm*—Kinney & Lange, P.A.

(57) ABSTRACT

A method includes sensing a process parameter to generate a sensor signal that includes a process signal and line noise components, digitizing the sensor signal at a sample rate, detecting line noise zero crossings in the sensor signal, determining a line noise frequency as a function of the detected line noise zero crossings, and adjusting the sample rate as a function of the line noise frequency to reduce an impact of line noise on the digitized sensor signal.

22 Claims, 6 Drawing Sheets

LINE NOISE ANALYSIS AND DETECTION AND MEASUREMENT ERROR REDUCTION

BACKGROUND

The present invention relates to noise management, and more particularly, to sensor measurement adjustments due to noise signatures of line noise coupled with a sensor signal.

Sensors are used in a variety of settings, such as monitoring processes in industrial process facilities, in order to generate data signals. These data signals can be transmitted to circuitry that performs digitizing, analysis, communication relay, or other functions. For data acquisition, quickly updated but highly accurate process measurements are generally desirable. In the field of industrial process measurement, updates generally refer to information transmissions to a control room or other control equipment, and a given process update can include a number of discrete sensor measurements bundled together, averaged together, etc.

However, during operation, line noise can often become coupled to data signals from a sensor. For example, power sources (or other noise sources) located near wires carrying sensor data signals can couple line noise to the data signals. Line noise from power sources typically produces an AC noise signal that has a frequency of about 60 Hz in the United States and about 50 Hz in Europe. Line noise can be especially problematic with certain types of sensors (e.g., temperature sensors) that are typically located remotely from processing circuitry, and have wires connecting the sensor to the processing circuitry. Line noise coupled to sensor data signals is undesirable, and presents a risk of measurement error.

Prior art industrial process measurement systems have provided a 50/60 Hz switch, that allows manual selection of either 50 Hz or 60 Hz filtering of sensor signals at the time of installation or maintenance to reduce line noise effects during later operation. This approach can be effective for many applications. However, the filtering selections are limited to predefined choices, and unpredictable noise sources can still present a risk of measurement error. Moreover, filtering selection using a manual switch presumes that a noise source is well-defined and known to an operator during system installation or maintenance. This presents a risk of operator error during setup, if the operator makes an incorrect filtering selection, and also can increase the time and effort required for system setup.

Furthermore, prior art industrial process measurement systems with a filtering selection switch use constant filtering. However, constant filtering (e.g., with a decimation filter) can reduce an update rate, and can increase power consumption by the process measurement system. Slower update rates are generally less desirable than faster ones. Also, industrial process measurement systems, particularly those that communicate wirelessly, can be powered by batteries or energy harvesting systems for which low power consumption is desirable.

SUMMARY

A method according to the present invention includes sensing a process parameter to generate a sensor signal that includes a process signal and line noise components, digitizing the sensor signal at a sample rate, detecting line noise zero crossings in the sensor signal, determining a line noise frequency as a function of the detected line noise zero crossings, and adjusting the sample rate as a function of the line noise frequency to reduce an impact of line noise on the digitized sensor signal.

DETAILED DESCRIPTION

In general, the present invention provides a system and method for detecting, analyzing and reducing line noise in a sensor signal. The present invention can help reduce an undesired impact of line noise coupled with a substantially DC process or data signal that is digitized by an analog-to-digital (A/D) converter. This can include adjustment of a sample rate of the A/D converter, and can further include adjustment of a decimation period of a filter associated with the A/D converter, in order to reduce a sensor signal error due to a line noise component of the sensor signal. Systems according to the present invention can include circuitry configured to perform many associated noise detection, analysis, and reduction functions automatically. In one aspect of the present invention, a method includes sensing a process parameter to generate a sensor signal that includes a process signal and line noise components, digitizing the sensor signal at a sample rate, detecting line noise zero crossings in the sensor signal, determining a line noise frequency as a function of the detected line noise zero crossings, and adjusting the sample rate as a function of the line noise frequency to reduce an impact of line noise on the digitized sensor signal. In another aspect of the present invention, a method of line noise management includes establishing a noise amplitude threshold, sensing a process parameter to generate a sensor signal that includes a process signal and line noise components, digitizing the sensor signal at a sample rate, comparing the sensor signal to the noise amplitude threshold, generating an interrupt signal indicative of when the sensor signal crosses the noise amplitude threshold, and lowering the sample rate as a function of the interrupt signal when an amplitude of the sensor signal is greater than or equal to the noise amplitude threshold.

Figure 1:
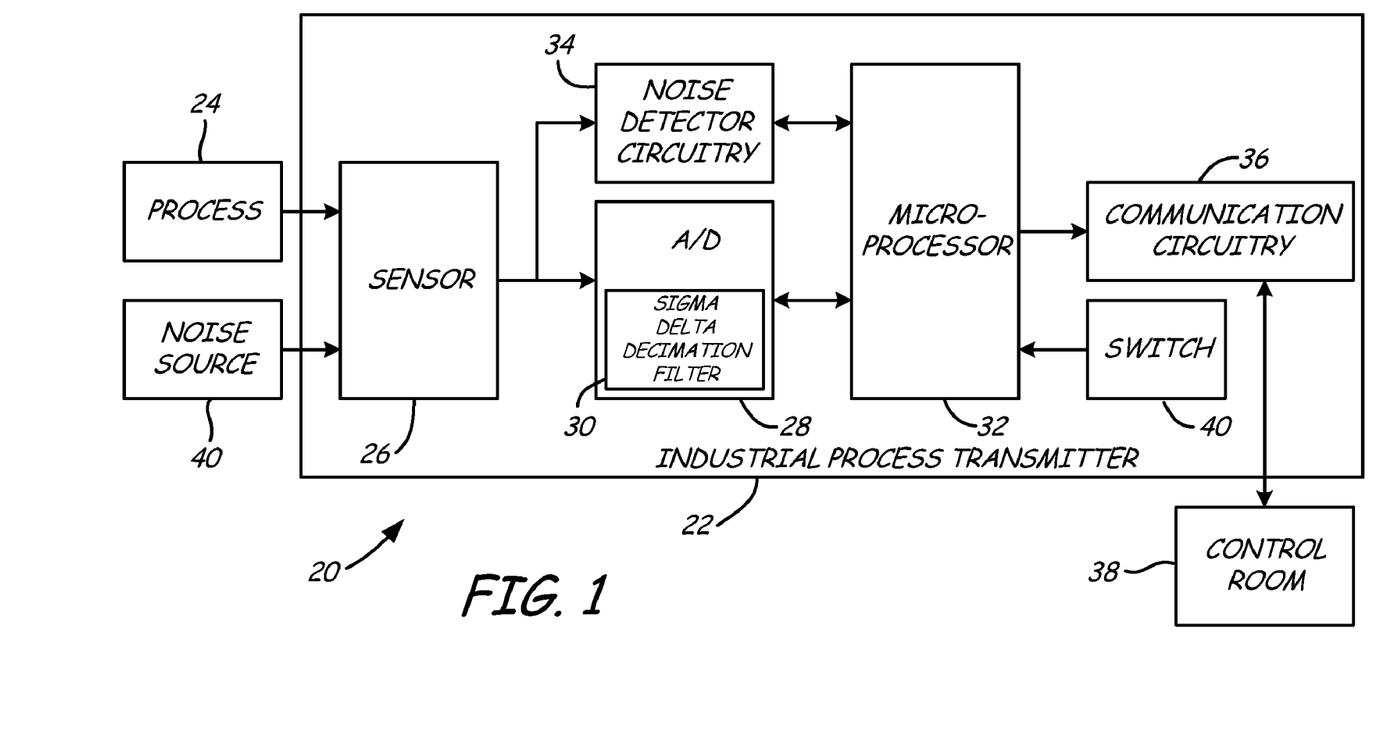
FIG. 1 is a block diagram of an industrial process measurement system according to the present invention.

FIG. 1 is a block diagram of an industrial process measurement system 20 with an industrial process transmitter 22 for sensing an industrial process 24. The industrial process 24 can be any type of process for which process management is desired, and will vary for particular applications. The industrial process transmitter 22 includes a sensor 26, an A/D converter 28 having a sigma delta decimation filter 30, a microprocessor 32, noise detector circuitry 34, and communication circuitry 36. The industrial process transmitter 22 can be operably connected to a control room 38, or other external device. It should be understood that in further embodiments the industrial process transmitter 22, and the system 20 more generally, can include additional components not shown in FIG. 1, such as a battery, energy harvesting subsystem, etc.

The sensor 26 is configured to sense a parameter associated with the industrial process 24. In one embodiment, the sensor 26 is a conventional temperature sensor. In alternative embodiments, the sensor 26 can be configured to sense nearly any parameter associated with the industrial process 24, such as pressure, vibration, flow, etc. The sensor 26 generates an analog sensor signal that is sent to the A/D converter 28 to be digitized. In the illustrated embodiment, a noise source 40 is present near the sensor 26. The noise source 40 can be any noise source, such as a nearby AC power system, and can couple a noise component to a process signal component of the sensor signal. The process signal component of the sensor signal reflects information related to the industrial process 24. Typically, the process signal component of the sensor signal is substantially DC, while the noise component of the sensor signal is AC.

The A/D converter 28 is operably connected to the sensor 26, and during operation digitizes the sensor signal at a sample rate. The sample rate of the A/D converter 28 is adjustable. In the illustrated embodiment, the sigma delta decimation filter 30 is integrated into the A/D converter 28. However, in alternative embodiments filter circuitry can be provided separate from the A/D converter 28, and can be of a type of that a sigma delta decimation filter. The filter 30 allows for notched attenuation of noise components in signals at specified frequencies controlled by an adjustable decimation period setting, which generally provides noise reduction at a specified frequency and harmonics thereof.

The noise detector circuitry 34 is operatively connected between the sensor 26 and the microprocessor 32, and also receives the sensor signal from the sensor 26. The noise detector circuitry 34 is capable of analyzing the sensor signal, including the noise component coupled to the process signal component therein, detecting parameters associated with the noise component, and generating interrupt signals as a function of the received sensor signal. Details of the configuration and operation of the noise detector circuitry are explained further below.

The microprocessor 32 can be a conventional processor of a type well-known in the art. The microprocessor is operably connected to the noise detector circuitry 34, the A/D converter 28 (including the sigma delta decimation filter 30) and the communication circuitry 36. The digitized sensor signal from the A/D converter 28 is sent to the microprocessor 32, which can perform any desired processing on the digitized signal, and can send the digitized sensor signal (or other signals generated as a function of the digitized sensor signal) to the communication circuitry 36. Typically, the microprocessor 32 will collect information from the digitized sensor signal over a period of time and transmit discrete updates to the communication circuitry 36. An update rate of the updates is equal to a conversion rate multiplied by the number of samples included in an update, where the conversion rate is related to a period of the sample rate of the A/D converter 28. The microprocessor 32 can send command signals to the A/D converter 28 and the sigma delta decimation filter 30. The microprocessor 32 can also send command signals to the noise detector circuitry 34, and receive interrupt signals from the noise detector circuitry 34. As explained further below, the microprocessor 32 can generate command signals for the A/D converter 28 and the sigma delta decimation filter 30 as a function of the interrupt signals from the noise detector circuitry 34.

The communication circuitry 36 is configured to transmit updates (or any other desired data) from the industrial process transmitter 22 to external locations, such as to the control room 38. The control room 38 can include displays, processors, memory, control software (e.g., AMS™ Suite and PlantWeb® software available from Emerson Process Management, Chanhassen, Minn.), and other components for managing and controlling the industrial process 24 and collecting and analyzing data from the industrial process transmitter 22. The communication circuitry 36 can be operably connected to the control room 38 via a wireless connection or a wired connection. Intermediate devices (not shown), such as wireless relays, can be operably connected in between the communication circuitry 36 and the control room 38.

In the embodiment illustrated in FIG. 1, the industrial process transmitter 22 includes an optional switch 40 that allows manual selection of line noise frequency from two or more preset options.

Figure 2:
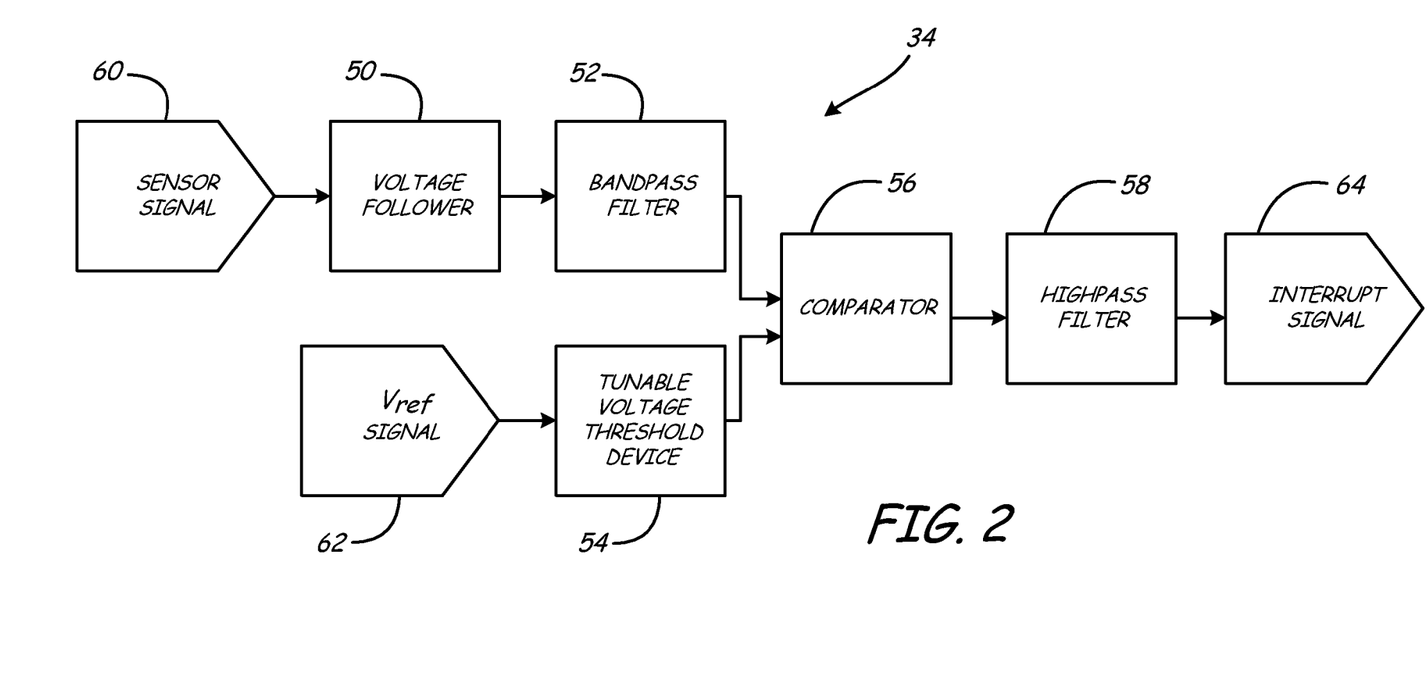
FIG. 2 is a block diagram of noise detector circuitry for use with the industrial process measurement system.

FIG. 2 is a block diagram of one embodiment of the noise detector circuitry 34 for the industrial process measurement system 20. As shown in FIG. 2, the noise detector circuitry 34 includes a voltage follower 50, a bandpass filter 52, a tunable voltage threshold device 54 (e.g., a digital potentiometer or other voltage divider), a comparator 56, and a highpass filter 58. A sensor signal 60 (i.e., the sensor signal from the sensor 26, as shown in FIG. 1) is an input to the voltage follower 50, which buffers the sensor signal 50. An output from the voltage follower 50 passes to the bandpass filter 52 for suitable filtering, and then passes to the comparator 56. The bandpass filter 52 can select a frequency range from near-DC to a little more than 120 Hz in order to help filter out DC components of the sensor signal 60 (e.g., process signals) so that AC components of the sensor signal 60 (e.g., noise) can be analyzed. A voltage reference ($V_{ref}$) signal 62 is provided to the tunable voltage threshold device 54, which can adjustably divide the $V_{ref}$ signal 62 as desired. The $V_{ref}$ signal 62 is a relatively stable voltage signal, such as a 1.225 V reference signal available within the industrial process transmitter 22 in a conventional manner. The output of the tunable voltage threshold device 54 passes to the comparator 56.

The comparator 56 makes a comparison between the buffered and filtered sensor signal 60 and the voltage divided $V_{ref}$ signal 62. Output from the comparator 56 passes through the highpass filter 58 to generate an interrupt signal 64, with the highpass filter 58 helping to produce short pulses in the interrupt signal 64. Based upon adjustment of the tunable voltage threshold device 54, the comparator 56 allows zero-crossing detection and other threshold crossing detection, as explained further below.

Figure 3:
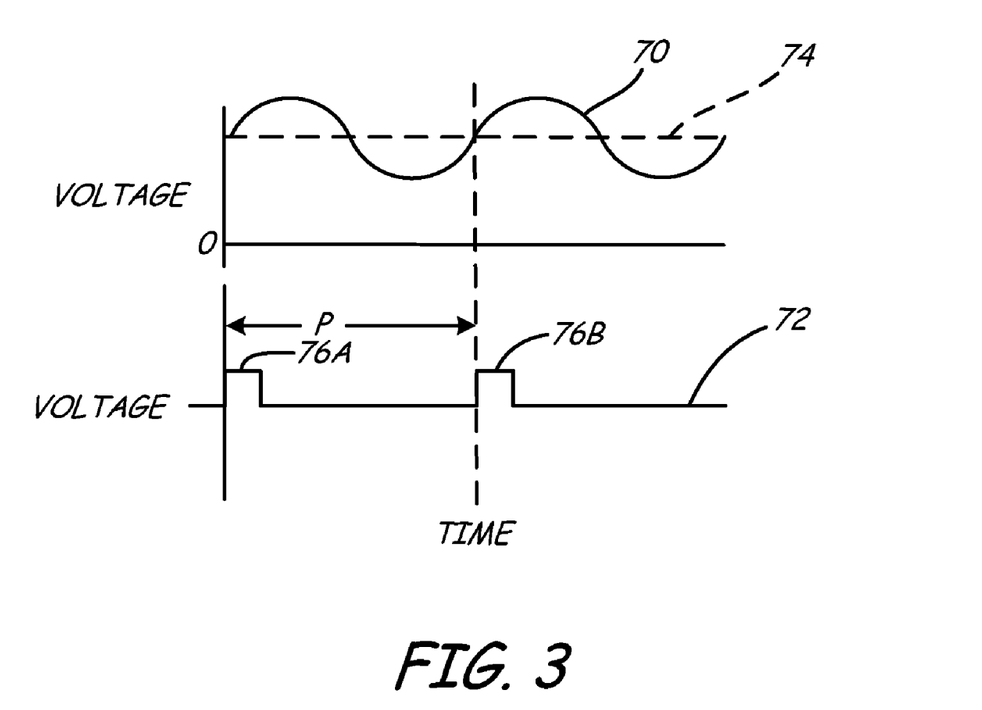
FIG. 3 is a graph of voltage versus time illustrating a sensor signal and an interrupt signal.

FIG. 3 is a graph of voltage versus time illustrating a sensor signal 70 (in a top portion of the graph) and an interrupt signal 72 (in a lower portion of the graph). The sensor signal 70 includes a substantially DC process signal component, represented in FIG. 3 as a DC offset 74 shown as a dashed line. The line noise component of the sensor signal 70 is typically AC, causing the sensor signal 70 to have a sinusoidal shape as shown in FIG. 3. The industrial process transmitter 22 is capable of filtering the input signal 70 to compensate for the DC offset 74, as described above. The noise detector circuitry 34 can then detect zero crossings of the filtered sensor signal 70, when the tunable voltage threshold device 54 is appropriately set to do so, and the interrupt signal 72 is generated as a function of zero crossings of the filtered sensor signal 70. Pulses 76A and 76B can be produced in the interrupt signal 72 to indicate positive-going zero crossings of the filtered sensor signal 70. In the embodiment shown in FIG. 3, only positive-going zero-crossings are reflected in the interrupt signal 72. The microprocessor 32 (or other suitable circuitry) can determine a line noise frequency period P by counting the time between pulses 76A and 76B in the interrupt signal 72.

Figure 4:
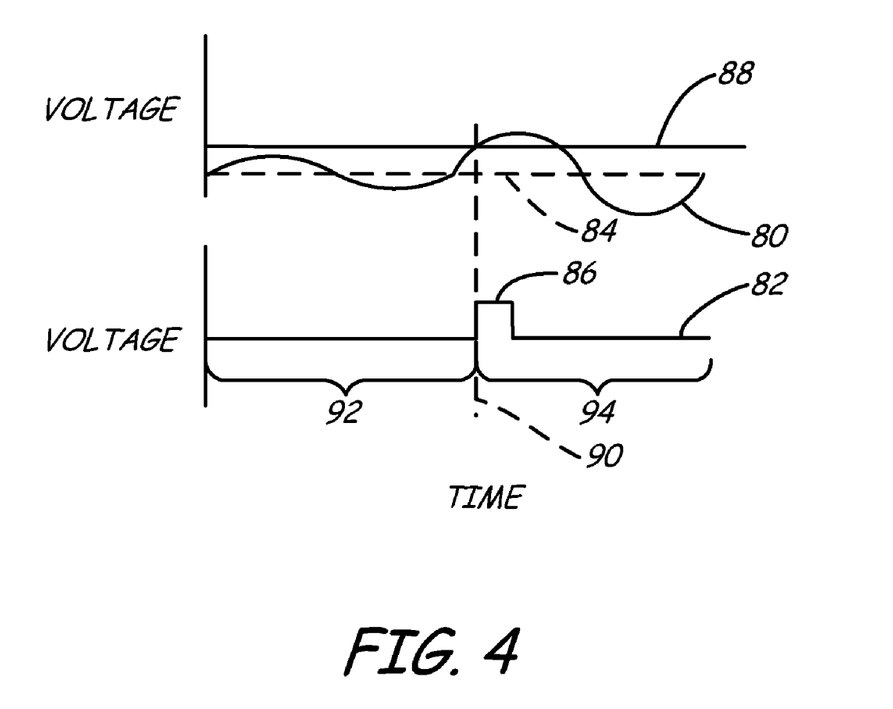
FIG. 4 is another graph of voltage versus time illustrating a sensor signal and an interrupt signal.

FIG. 4 is another graph of voltage versus time illustrating a sensor signal 80 (in a top portion of the graph) and an interrupt signal 82 (in a lower portion of the graph). The sensor signal includes a process signal component represented by a DC offset 84 shown as a dashed line. The interrupt signal 82 includes a pulse 86. A noise amplitude threshold 88 is shown relative to the sensor signal 80. The magnitude of the noise amplitude threshold 88 can be selected by the microprocessor 32 at a suitable level for particular applications. For instance, the noise amplitude threshold 88 can be about 1 V or less in one embodiment, and can be about 100 mV or less in another embodiment. As shown in FIG. 4, the sensor signal 80, after filtering by the noise detector circuitry 34, initially has an amplitude below the noise amplitude threshold 88. Over time, the amplitude of a line noise component of the sensor signal 80 increases in the illustrated embodiment, and the sensor signal 80 reaches and crosses above the noise amplitude threshold 88 at time 90. The pulse 86 in the interrupt signal 82 is generated at time 90, indicative of the sensor signal 80 reaching the noise amplitude threshold 88.

As will be explained in greater detail, the industrial process transmitter 22 can adjust the sample rate of the A/D converter 28 to a first sample rate (e.g., a relatively fast sample rate) during a first time period 92, and when the pulse 86 is generated in the interrupt signal 82 at time 90 a second time period 94 can commence where the sample rate of the A/D converter 28 is adjusted to a second sample rate (e.g., a relatively slow sample rate). In general, this allows updates to be generated by the industrial process transmitter 22 relatively quickly during the first time period 92, which allows faster data collection and reduced total power consumption without any significant reduction in measurement accuracy due to line noise. At low amplitudes, the line noise component of the sensor signal 80 has negligible adverse effects. During the second time period 94, the second sample rate allows for better filtering of line noise, though updates are somewhat slower. This adjustment process allows updates to be slowed only in limited circumstances when line noise components of the sensor signal 80 reach the noise amplitude threshold, but otherwise allows updates to be performed quickly with relatively low power consumption.

Figure 5:
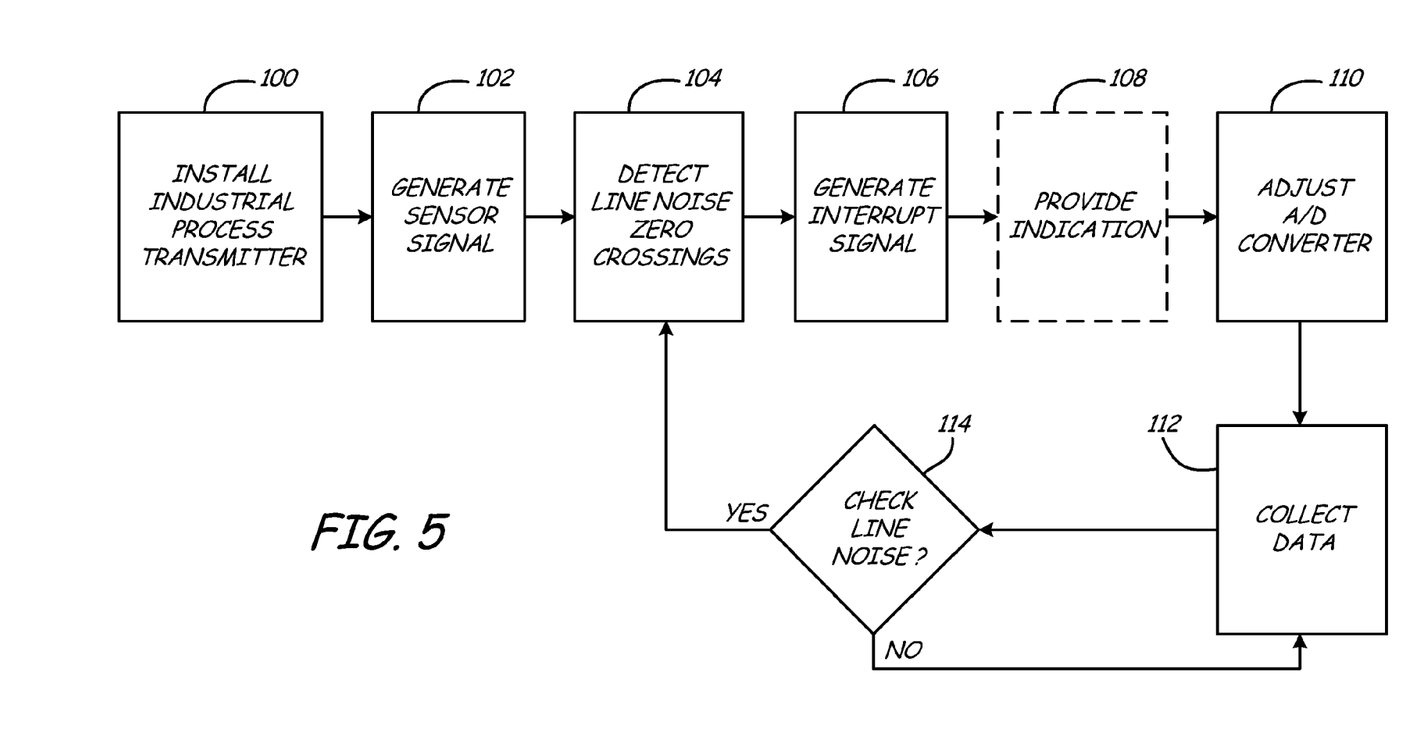
FIG. 5 is a flow chart illustrating a method of line noise control according to the present invention.

FIG. 5 is a flow chart illustrating a method of line noise control. First, the industrial process transmitter 22 is installed at a desired location for sensing the industrial process 24 (step 100). The sensor 26 then generates a sensor signal (step 102). The line noise detector circuitry 34 can detect line noise zero crossings as a function of the sensor signal (step 104). An interrupt signal is generated as a function of the detected line noise zero crossings (step 106). As a function of the interrupt signal, and indication can optionally be provided (e.g., at the control room 38 or a display at the transmitter 22) (step 108), such as in embodiments performed using an industrial process transmitter 22 that include the switch 40.

Next, an adjustment is made to the A/D converter 28 to adjust the sample rate as a function of the interrupt signal (step 110). This step can include selecting the sample rate of the A/D converter 28 to be a multiple of the line noise frequency period P. The sample rate can increase or decrease as a result of this adjustment. In addition, this step can include making a corresponding adjustment of the sigma delta decimation filter 30 of the A/D converter 28 to correspond to the line noise frequency period P. Adjustments to the A/D converter 28 and the sigma delta decimation filter 30 can be governed by commands from the microprocessor 32.

Once the adjustment of the A/D converter 28 has been accomplished, the industrial process transmitter can proceed to collect data (step 112). Previous steps can be performed as part of a start-up or calibration procedure that is performed upon installation of the industrial process transmitter 22 at step 100. Steps 102-110 need not be performed again, though in some embodiments it may be desirable to periodically or intermittently perform steps 104-110 again. Thus, a decision can be made to check the line noise (step 114). If a line noise check is desired, the process can be repeated beginning with detecting line noise zero crossings at step 104. This decision can be governed by a defined schedule, or can be performed as needed whenever line noise is problematic or recalibration is desired.

Figure 6:
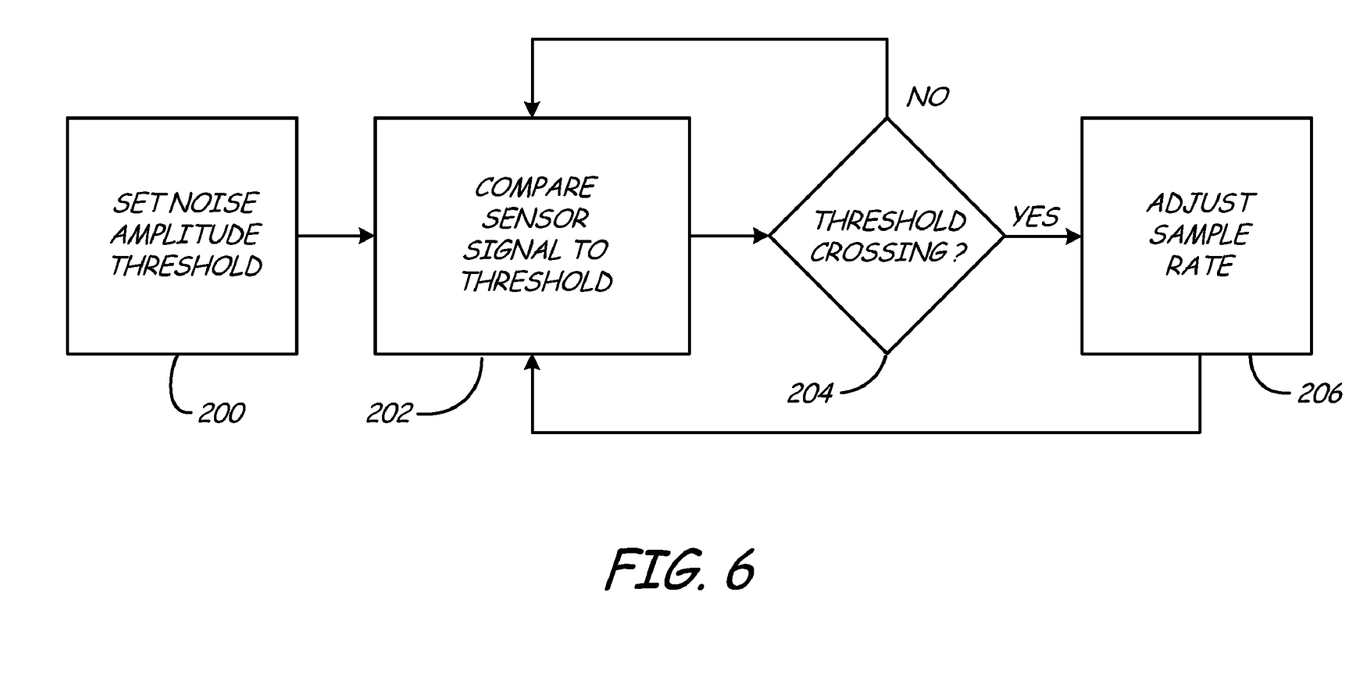
FIG. 6 is a flow chart illustrating another method of line noise control according to the present invention.

FIG. 6 is a flow chart illustrating another method of line noise control. This method can be performed in conjunction with or independently from the method described with respect to FIG. 5. As shown in FIG. 6, a noise amplitude threshold 88 is initially set (step 200). The noise amplitude threshold 88 can be established by the microprocessor 32, such as where a stored value is accessed by the microprocessor 32. The microprocessor 32 can command the noise detector circuitry 34 to adjust the tunable voltage threshold device 54 to a desired voltage level associated with the noise amplitude threshold 88.

During operation of the industrial process transmitter 22, the sensor signal 80 generated by the sensor 26 is compared to the noise amplitude threshold 88 by the comparator 56 of the noise detector circuitry 34 (step 202). It is determined whether or not there is a threshold crossing (step 204), which can be reflected in the interrupt signal 82. If there has been a threshold crossing, then the A/D converter 28 can be adjusted (step 206). Adjustment of the A/D converter can include adjustment of the sample rate as well as adjustment of the decimation period of the sigma delta decimation filter 30. For example, where there is a positive-going threshold crossing the sample rate of the A/D converter 28 can be lowered from a first, higher rate to a second, lower rate (e.g., the sample rate determined according to the method described with respect to FIG. 5) with a corresponding adjustment of the decimation period. The particular sample rate and decimation period adjustments can be determined as a function of the line noise frequency period P. If the sensor signal 80 drops below the noise amplitude threshold for at least a full line noise frequency period P or some other specified time period, that is, when no positive-going threshold crossings are detected for a given time period, the sample rate can be increased (e.g., from the second, slower sample rate to the first, higher sample rate). In this way, the sample rate of the A/D converter 28 can be as high as possible given current line noise conditions, with sample rate (and corresponding update rate) reductions only when dictated by relatively high line noise levels. This allows updates to the control room 38 to be performed relatively quickly, and with the sensor 26 consuming power for only relatively short periods of time for a given update. The method of FIG. 6 can be performed substantially continuously during sensing operation of the industrial process transmitter 22, meaning the method can return to step 202 by default.

Although the present invention has been described with reference to preferred embodiments, workers skilled in the art will recognize that changes may be made in form and detail without departing from the spirit and scope of the invention. For example, various methods of the present invention can be performed in conjunction with one another, or separately. Moreover, the present invention can be utilized to control line noise experienced with many types of signals, not merely sensor signals generated in industrial process measurement settings.

The invention claimed is:

1. A method comprising:
sensing a process parameter to generate a sensor signal that includes a process signal and line noise components;
digitizing the sensor signal at a sample rate;
detecting line noise zero crossings in the sensor signal;
determining a line noise frequency as a function of the detected line noise zero crossings; and
adjusting the sample rate as a function of the line noise frequency to reduce an impact of line noise on the digitized sensor signal.

2. The method of claim 1, wherein the step of adjusting the sample rate as a function of the line noise frequency comprises:
indicating a frequency of the line noise; and
actuating a manual switch to select the sample rate for an analog-to-digital converter from a plurality of setting options as a function of the frequency of the line noise such that the sample rate corresponds to a multiple of the line noise frequency period.

3. The method of claim 1, wherein the step of adjusting the sample rate as a function of the line noise frequency comprises:
generating an interrupt signal as a function of the line noise zero crossing;
transmitting the interrupt signal to a microprocessor;
generating an analog-to-digital converter control signal with the microprocessor as a function of the interrupt signal; and
controlling the sample rate in conformance with the analog-to-digital converter control signal.

4. The method of claim 1 and further comprising:
adjusting a decimation period of a filter configured to filter the sensor signal.

5. The method of claim 1, wherein only positive-going zero crossings represented by the interrupt signal are analyzed to determine the line noise frequency.

6. The method of claim 1 and further comprising:
establishing a noise amplitude threshold;
comparing the sensor signal to the noise amplitude threshold;
generating an interrupt signal indicative of when the sensor signal crosses the noise amplitude threshold;
lowering the sample rate from a first rate to a second rate as a function of the interrupt signal when an amplitude of the input signal is greater than or equal to the noise amplitude threshold, wherein the second rate corresponds to the sample rate to which adjustment is made to reduce the impact of line noise on the digitized sensor signal.

7. The method of claim 1, wherein the step of detecting a line noise zero crossing in the input signal comprises:
adjusting a tunable voltage threshold to zero; and
comparing the sensor signal and the tunable voltage threshold.

8. The method of claim 1, wherein adjusting the sample rate to reduce an impact of line noise on the digitized sensor signal comprises adjusting the sample rate to a multiple of the line noise frequency.

9. The method of claim 1, wherein the process signal component of the sensor signal is a substantially DC electrical signal.

10. A method of line noise management comprising:
establishing a noise amplitude threshold;
sensing a process parameter to generate a sensor signal that includes a process signal and line noise components;
digitizing the sensor signal at a sample rate;
comparing the sensor signal to the noise amplitude threshold;
generating an interrupt signal indicative of when the sensor signal crosses the noise amplitude threshold; and
lowering the sample rate as a function of the interrupt signal when an amplitude of the sensor signal is greater than or equal to the noise amplitude threshold.

11. The method of claim 10 and further comprising:
buffering the sensor signal with a voltage follower;
filtering the buffered sensor signal from the voltage follower with a bandpass filter;
providing a reference voltage; and
establishing the noise amplitude threshold as a function of the reference voltage and a tuning setting.

12. The method of claim 10 and further comprising:
detecting line noise zero crossings of the sensor signal;
determining a line noise frequency as a function of line noise zero crossings; and
adjusting the sample rate as a function of the line noise frequency, wherein the sample rate is adjusted to reduce an impact of line noise on the digitized sensor signal.

13. The method of claim 12, wherein the step of adjusting the sample rate as a function of the line noise frequency comprises:
indicating a frequency of the line noise; and
actuating a manual switch to select the sample rate for an analog-to-digital converter from a plurality of setting options as a function of the frequency of the line noise such that the sample rate corresponds to a multiple of the line noise frequency period.

14. The method of claim 12, wherein the step of adjusting the sample rate as a function of the line noise frequency comprises:
generating an interrupt signal indicative of when the sensor signal crosses the noise amplitude threshold;
generating an analog-to-digital converter control signal as a function of the interrupt signal; and
controlling the sample rate in conformance with the analog-to-digital converter control signal.

15. The method of claim 12, wherein adjusting the sample rate to reduce an impact of line noise on the digitized sensor signal comprises adjusting the sample rate to a multiple of the line noise frequency.

16. The method of claim 12, wherein only positive-going zero crossings are analyzed to determine the line noise frequency.

17. The method of claim 12, wherein the step of detecting line noise zero crossings of the sensor signal comprises:
adjusting the tunable voltage threshold to zero; and
comparing the sensor signal and the tunable voltage threshold.

18. The method of claim 10, wherein the noise threshold is a fixed value.

19. An industrial process transmitter assembly comprising:
a sensor for sensing a process parameter and generating a sensor signal as a function of the process parameter;
an analog-to-digital converter having filter circuitry, wherein the analog-to-digital converter is configured to receive the sensor signal and to generate a digitized sensor signal at a sample rate;
noise detector circuitry comprising:
a voltage follower configured to receive the sensor signal;
a bandpass filter operably connected to the voltage follower;
a tunable voltage threshold input; and a comparator operably connected to both the bandpass filer and the tunable voltage threshold input, and configured to generate an interrupt signal as a function of the sensor signal; and a microprocessor operably connected to the analog-to-digital converter and to the noise detector circuitry, wherein the microprocessor is configured to control the analog-to-digital converter as a function of the interrupt signal and to produce an output signal based upon the digitized sensor signal.

20. The assembly of claim 19, the noise detector circuitry further comprising:

a high pass filter operably connected to the comparator.

21. The assembly of claim 19, wherein the filter of the analog-to-digital converter comprises a sigma delta decimation filter.

22. The assembly of claim 19, wherein the sensor is a temperature sensor.

* * * * *

UNITED STATES PATENT AND TRADEMARK OFFICE
CERTIFICATE OF CORRECTION

PATENT NO. : 7,821,437 B1  
APPLICATION NO. : 12/420461  
DATED : October 26, 2010  
INVENTOR(S) : Jason Harold Rud et al.

Page 1 of 1

It is certified that error appears in the above-identified patent and that said Letters Patent is hereby corrected as shown below:

On Title Page, Item (65) Column 1 the Prior Publication Data is missing:

Insert --Prior Publication Data
U.S. 2010/0259434 A1 Oct. 14, 2010--

Signed and Sealed this
Twenty-third Day of August, 2011

David J. Kappos
*Director of the United States Patent and Trademark Office*